(12) United States Patent
Scullin et al.

(10) Patent No.: US 9,263,236 B2
(45) Date of Patent: Feb. 16, 2016

(54) SENSING OF PLASMA PROCESS PARAMETERS

(75) Inventors: Paul Scullin, Lucan (IE); David Gahan, Terenure (IE); Donal O'Sullivan, Clonsilla (IE)

(73) Assignee: IMPEDANS LTD, Dublin (IE)

( * ) Notice: Subject to any disclaimer, the term of this patent is extended or adjusted under 35 U.S.C. 154(b) by 486 days.

(21) Appl. No.: 13/641,992

(22) PCT Filed: Apr. 21, 2011

(86) PCT No.: PCT/EP2011/056460
§ 371 (c)(1),
(2), (4) Date: Nov. 5, 2012

(87) PCT Pub. No.: WO2011/131769
PCT Pub. Date: Oct. 27, 2011

(65) Prior Publication Data
US 2013/0056155 A1    Mar. 7, 2013

(30) Foreign Application Priority Data

Apr. 21, 2010 (IE) .................................. S2010/0241

(51) Int. Cl.
| | |
|---|---|
| C23F 1/00 | (2006.01) |
| H01L 21/306 | (2006.01) |
| H01J 37/32 | (2006.01) |
| C23C 16/52 | (2006.01) |
| H01L 21/66 | (2006.01) |

(52) U.S. Cl.
CPC ........... *H01J 37/32082* (2013.01); *C23C 16/52* (2013.01); *H01J 37/3299* (2013.01); *H01J 37/32174* (2013.01); *H01J 37/32623* (2013.01);
(Continued)

(58) Field of Classification Search
CPC ....................... H01J 37/32917–37/3299; H01J 37/32–37/32311; H01L 22/00–22/34; C23C 16/52

USPC .................... 156/345.24–345.28; 216/59–61; 438/5–18; 427/8–10, 585
See application file for complete search history.

(56) References Cited

U.S. PATENT DOCUMENTS

| | | | |
|---|---|---|---|
| 5,746,513 A | 5/1998 | Renken | |
| 5,939,886 A * | 8/1999 | Turner et al. | 324/464 |

(Continued)

OTHER PUBLICATIONS

Freed, Mason et al. "Autonomous On-Wafer Sensors for Process Modeling, Diagnosis and Control." IEEE Transactions on Semiconductor Manufacturing, IEEE Service Center, Piscataway, NJ, US. Aug. 1, 2001. vol. 14, No. 3. pp. 255-264.

*Primary Examiner* — Rakesh Dhingra
(74) *Attorney, Agent, or Firm* — Whiteford, Taylor & Preston, LLP; Gregory M. Stone

(57) ABSTRACT

A system for monitoring a condition in an enclosed plasma processing space (102). The system comprises a sensor (338), arranged to be provided within the enclosed plasma processing space, for sensing a condition in the enclosed plasma processing space and a modulation circuit (342), connected to the sensor, and arranged to modulate an output of the sensor to provide a modulated signal. The system further comprises a first transmission line coupler (330) arranged to be disposed within the enclosed plasma processing space. The first transmission line coupler (546) is connected to the modulation circuit and is arranged to couple the modulated signal to a transmission line, which is arranged to deliver energy into the enclosed plasma space. The system further comprises a second transmission line coupler, arranged to be disposed outside the enclosed plasma processing space and coupled to the transmission line and a demodulator (550), connected to the second coupler, for receiving and demodulating the modulated signal.

12 Claims, 3 Drawing Sheets

(52) U.S. Cl.
CPC ..... *H01J 37/32926* (2013.01); *H01J 37/32935* (2013.01); *H01L 22/12* (2013.01); *H01L 22/14* (2013.01); *H01L 22/34* (2013.01)

(56) References Cited

U.S. PATENT DOCUMENTS

| | | | |
|---|---|---|---|
| 6,110,322 A * | 8/2000 | Teoh et al. | 156/345.52 |
| 6,326,794 B1 | 12/2001 | Lundquist | |
| 6,691,068 B1 | 2/2004 | Freed et al. | |
| 6,830,650 B2 | 12/2004 | Roche et al. | |
| 6,974,550 B2 * | 12/2005 | Benjamin et al. | 216/61 |
| 2003/0209430 A1 * | 11/2003 | Hamamoto | 204/298.01 |
| 2004/0127030 A1 * | 7/2004 | Klekotka | 438/689 |
| 2005/0185171 A1 | 8/2005 | Samukawa | |
| 2006/0249729 A1 | 11/2006 | Mundt | |
| 2007/0107844 A1 * | 5/2007 | Bullock et al. | 156/345.28 |
| 2011/0259851 A1 * | 10/2011 | Brouk et al. | 216/61 |

* cited by examiner

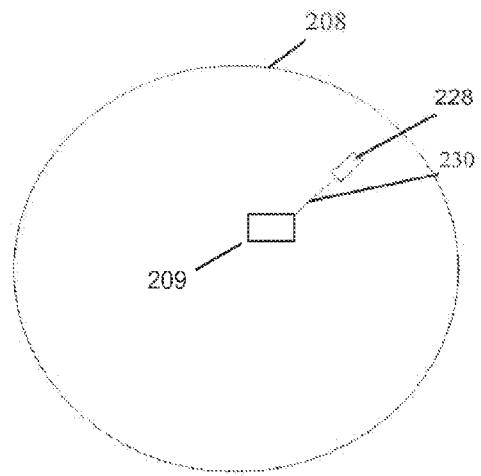
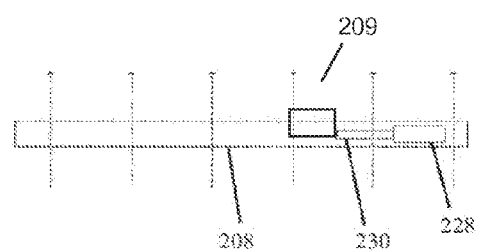
Fig. 2a　　　　　　　　　Fig. 2b
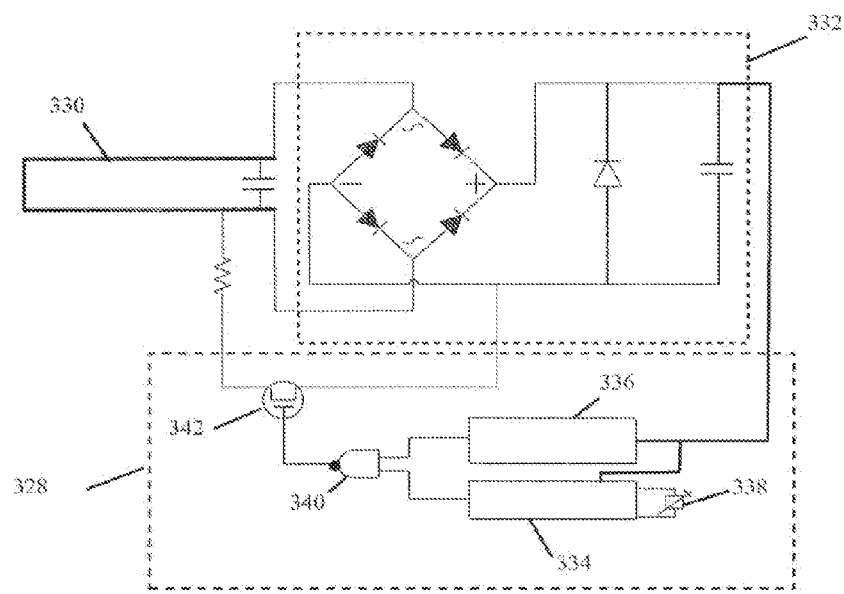
Fig. 3

SENSING OF PLASMA PROCESS PARAMETERS

TECHNICAL FIELD

This invention relates to the sensing of process parameters and in particular to the deployment of sensors within enclosed processing spaces. The invention has particular application in the sensing of plasma process parameters.

BACKGROUND ART

Plasma processing systems are widely used to process substrates. Examples would be etching of silicon wafers in semiconductor manufacture and the deposition of layers in the manufacture of solar cells. The range of plasma applications is wide but includes plasma enhanced chemical vapour deposition, resist stripping operations and plasma etching.

There is a need in industry to deploy sensors in plasma processes to measure key process parameters as a function of position and time, in order to reduce process development time and increase process control, and for fault detection and resolution. These applications often require spatial mapping with the distribution of multiple sensors within the processing area.

In recent years a number of approaches to obtain position- and time-dependent data using in-situ and substantially real-time instrumentation and measurement have been proposed.

U.S. Pat. No. 5,746,513 discloses a temperature calibration substrate with a cavity located below the substrate surface of said and a thermocouple disposed in the cavity for measuring the temperature of the substrate. The cavity includes a cavity opening, an inner perimeter, and a length. Heat transfer means is disposed in the cavity means between the thermocouple and the inner perimeter of the cavity for transferring heat from the substrate to the thermocouple. The cavity is shaped to allow the thermocouple to lay in close proximity to the substrate, and the thermocouple is positioned substantially adjacent the inner perimeter of the cavity and traverses the length of the cavity means thereby enhancing heat transfer efficiency from the substrate to the thermocouple means.

U.S. Pat. No. 6,691,068 discloses a complete measurement system with distributed sensors on a workpiece. The system employs a sensor apparatus that includes an information processor, embedded executable commands for controlling the apparatus, and at least one sensor. The information processor and sensor are supported on the substrate. The sensor converts the measured operating characteristics into digital data, which is either stored in the sensor apparatus for later retrieval (i.e. when the work-piece is removed from the plasma chamber) or stored and transmitted wirelessly to an external receiver.

U.S. Pat. No. 6,830,650 discloses a wafer probe for measuring plasma and surface characteristics in plasma processing environment that utilizes integrated sensors on a wafer substrate. A microprocessor mounted on the substrate receives input signals from the integrated sensors to process, store, and transmit the data. A wireless communication transceiver receives the data from the microprocessor and transmits information outside of the plasma processing system to a computer that collects the data during plasma processing. There is also provided a self-contained power source that utilizes the plasma for power that is comprised of a topographically dependent charging device or a charging structure that utilizes stacked capacitors.

The use of wireless transmission (or storage and wireless transmission) to transmit the data from the sensors for subsequent analysis is not without problems.

In plasma processes the transmission of radio-frequency signals through the plasma is hindered by the fact that the plasma is a conductor, which shields the antenna. This can be overcome by ensuring the carrier frequency is higher than the electron plasma frequency, typically by using a carrier frequency in the 1-100 GHz band. Thus, it is possible to use a carrier in the microwave, infrared or optical portion of the spectrum (as suggested in U.S. Pat. No. 6,691,068), but this requires essential line of sight communication between the external receiving antenna and the antenna attached to the sensor. Alternatively, if lower frequencies are to be used, the data must be stored for transmission when the plasma is off, increasing the size and complexity of the plasma processing system.

The placing of a complete measurement system including sensors, multiplexing, digitizer, executable instructions and storage system on a work-piece means that the data from the sensors is digitised and stored on the work-piece. The work-pieces are often in hostile environments with RF and magnetic fields that increase the likelihood of noise contamination of the sensor data. Leads from the sensors to the microprocessor are particularly vulnerable, they can act as antenna and need complex shielding to minimise disturbance.

The local bias on the workpiece is often different at different locations and substantially different from the other parts of the tool. Therefore analog sensor data is modified and maintaining an electrically floating sensor is difficult.

Specifically, the requirement of the present art to digitise the sensor data means that an analog to digital converter (ADC) is located on the workpiece, and analog data needs to be routed across the workpiece to the ADC leading to issues with noise pickup.

It is also clear that the high power required to run an ADC, particularly where high speed and high resolution is required, is a limiting factor. If high-speed data is required the storage of data will consume larger amounts of space and power, which are limited inside the system.

DISCLOSURE OF THE INVENTION

There is provided a system for monitoring a condition in an enclosed plasma processing space, comprising:
(a) a sensor, arranged to be provided within said enclosed plasma processing space, for sensing a condition in said enclosed plasma processing space;
(b) a modulation circuit connected to said sensor and arranged to modulate an output of said sensor to provide a modulated signal;
(c) a first transmission line coupler arranged to be disposed within said enclosed plasma processing space, connected to said modulation circuit and arranged to couple said modulated signal to a transmission line, said transmission line being arranged to deliver energy into said enclosed plasma space;
(d) a second transmission line coupler arranged to be disposed outside said enclosed plasma processing space and coupled to said transmission line; and
(e) a demodulator connected to said second coupler for receiving and demodulating said modulated signal.

Unlike RFID-based sensor systems, the present system allows remote monitoring of a sensor without requiring a receiver in the near field. Whereas RFID and other near field wireless systems depend on the separation and signal strength between transmitter and receiver, the present system couples a modulated signal into a transmission line, so that it will be transmitted along the transmission line for long distances. Thus the second coupler is picking up the induction field from the local transmission line current, and not from a transmitter located at the sensor.

Preferably, said modulation circuit is arranged to modulate said output of said sensor onto a carrier signal to provide the modulated signal.

Preferably, the modulation circuit further comprises a power source, the power source comprising a voltage regulation circuit connected to said first coupler, the voltage regulation circuit being driven by power scavenged from the transmission line by the first coupler.

Further, preferably, the modulation circuit further comprises a first oscillator for generating said carrier signal from power scavenged from the transmission line by the first coupler.

Further, preferably, the sensor comprises a second oscillator whose frequency depends on said condition sensed in said enclosed plasma processing space, wherein the modulation circuit is arranged to modulate said carrier signal with an output of said second oscillator.

In a preferred embodiment, the system further comprises an identifying code generator providing, at an output, an identifying code signal, said identifying code signal being combined with an output of said second oscillator and provided to said modulation circuit to modulate said carrier also with the identifying code.

In a further preferred system, a plurality of sensors are provided and a corresponding plurality of identifying code generators are provided, each being associated with a corresponding sensor, whereby the output of each of said sensors is modulated with the respective identifying code to provide a composite modulation unique to each sensor, the carrier signal being modulated with a plurality of said composite modulations such that the demodulator can provide a corresponding plurality of output signals, each being identified with a unique code identifying a particular one of said sensors.

Preferably, said sensor is provided on a substrate to be processed and said first transmission line coupler is a coil arranged to form a loop comprising two plane strips embedded in said substrate.

Preferably, said first transmission line coupler has a length of approximately 100 mm and a depth of approximately 0.5 mm.

Preferably, said first transmission line coupler exhibits an insertion loss of about 40 to 50 dB.

Preferably, the first and second transmission line couplers are bidirectional couplers enabling bidirectional data transmission along the transmission line.

The present invention further provides a plasma processing tool comprising:
a) an enclosed plasma processing space;
b) a transmission line for delivering energy into said enclosed plasma processing space; and
c) a system for monitoring a condition in the enclosed plasma processing space comprising:
  a. a sensor, arranged to be provided within said enclosed plasma processing space, for sensing a condition in said enclosed plasma processing space;
  b. a modulation circuit connected to said sensor and arranged to modulate an output of said sensor to provide a modulated signal;
  c. a first transmission line coupler arranged to be disposed within said enclosed plasma processing space, connected to said modulation circuit and arranged to couple said modulated signal to a transmission line, said transmission line being arranged to deliver energy into said enclosed plasma space;
  d. a second transmission line coupler arranged to be disposed outside said enclosed plasma processing space and coupled to said transmission line; and
  e. a demodulator connected to said second coupler for receiving and demodulating said modulated signal.

Preferably, said condition is a processing parameter of the plasma processing tool.

Preferably, said processing parameter any one of temperature, etch speed ion flux to a surface of said substrate, floating potential of a surface of a substrate to be processed, electric field uniformity at a surface of a substrate to be processed, and layer thickness of a substrate to be processed.

The present invention further provides a method of monitoring a condition in an enclosed plasma processing space, comprising:
a) sensing a condition within said enclosed plasma processing space;
b) producing an output based on said condition;
c) modulating said output to provide a modulated signal;
d) coupling said modulated signal to a transmission line within said enclosed plasma space, the transmission line being arranged to deliver energy into said enclosed plasma space;
e) decoupling said modulated signal from said transmission line externally from said enclosed plasma space; and
f) demodulating said modulated signal.

Embodiments of the invention will now be described, by way of example, with reference to the accompanying drawings, in which:

FIG. 2a depicts the substrate of FIG. 1 having a sensor disposed thereon, according to a preferred embodiment of the present invention;

FIG. 2b depicts an orientation of a transmission line coupler attached to the sensor of FIG. 2a, with respect to bias current flow from an RF power source;

FIG. 3 is a circuit diagram of the coupler of FIG. 2b and CMOS circuit arrangement, according to a first embodiment of the present invention;

Figure 1:
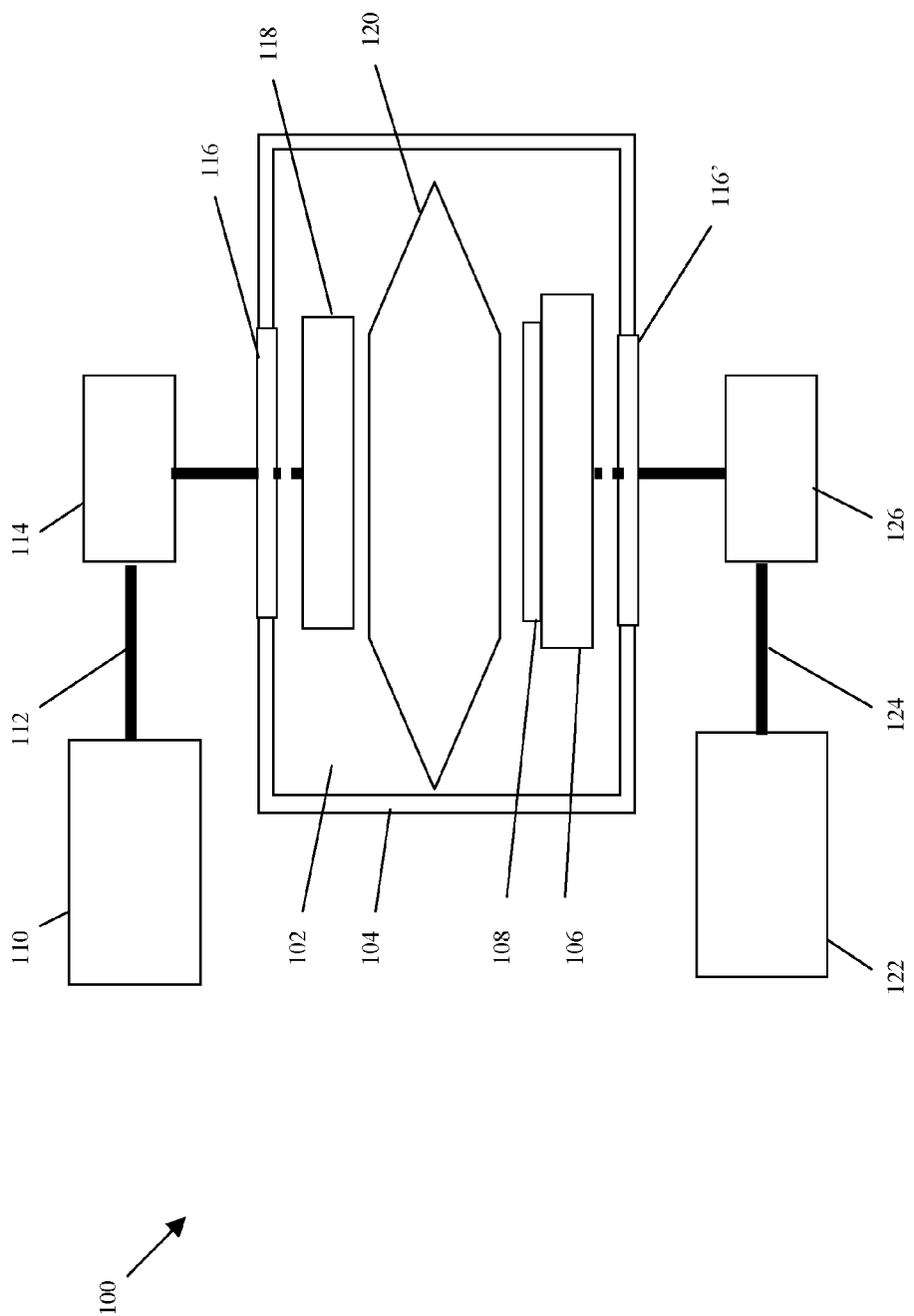
FIG. 1 is a schematic of a plasma processing tool including a substrate to be processed.

Referring now to FIG. 1, there is illustrated a schematic of a plasma-processing tool generally indicated at 100. The plasma-processing tool 100 comprises a chamber 102 having a grounded conductive chamber wall 104 and is arranged to contain a chamber gas, such as Argon or Neon. The chamber 102 comprises a chuck or work-piece 106 for holding a wafer or substrate 108 to be processed.

An RF power supply 110 is connected via a transmission line 112 and matching unit 114 through a dielectric window 116 provided in the chamber wall 104 to a top electrode 118 in the chamber 102. On application of RF power to the top electrode 118, the chamber gas becomes ionised and forms a plasma 120. The plasma 120 behaves as a conductor, reducing an impedance between the top electrode 118 and the work-piece 106, and thereby allowing the RF current to flow through a resulting transmission line within the chamber 102.

Although the application of the RF power results in the formation of the plasma chamber transmission line between the top electrode 118 and the work-piece 106, gas in some regions of the chamber 102 will not become sufficiently ionised to form plasma. These regions are knows as sheaths (not shown) and exhibit characteristics of a dielectric. In general, sheaths will form at the chamber walls 104 and at the work-piece 106 or substrate 108. In the case where a sheath forms at the work-piece 106 or substrate 106, and as a consequence, along the plasma chamber transmission line, the sheath behaves like an in-line capacitor and does not significantly impede the operation of the chamber 102 as a transmission line. Furthermore, in the absence of plasma 120, a gap between the top electrode 118 and the work-piece 106 is an in-line capacitance and an implicit transmission line still exists.

Referring again to FIG. 1, a bias RF power supply 122 is connected via a transmission line 124 and matching unit 126 through a dielectric window 116' provided in the chamber wall 104 to the work-piece 106. Accordingly, on application of an RF bias, a plasma generated DC bias can be placed on the substrate 108, to thereby control processing parameters associated with the plasma-processing tool, for example, an etch rate for a given substrate being processed.

FIG. 2a depicts a substrate 208 having a sensor 209 disposed thereon. However, it will be appreciated that the sensor 209 may be provided at any suitable location within the plasma-processing tool 100, for example, on the work-piece 106, on the chamber wall 104, or elsewhere within the chamber 102. The sensor 209 is connected to a CMOS circuit 228 and is arranged to sense a processing parameter of the plasma-processing tool 100. In the present embodiment of the invention, the sensor 209 is arranged to sense temperature. However, it will be appreciated that the sensor 209 may be arranged to measure other processing parameters, such as etch speed, ion flux to a surface of the substrate 108, floating potential of the surface, electric field uniformity at the substrate, layer thickness.

A transmission line coupler 230 is attached to the sensor 209 and is orientated to maximise magnetic flux linkage from the bias current flow from the RF bias power, as illustrated in FIG. 2b. In the preferred embodiment, the coupler 230 is a coil, which forms a loop by means of two plane strips embedded in the substrate 208.

Referring now to FIG. 3, there is illustrated a circuit diagram of the coupler 330 and CMOS circuit 328 arrangement, according to a first embodiment of the present invention.

In this embodiment, the substrate 108, 208 is biased at 13.56 MHz. Typically, a few hundred to several thousand Volts are present at the substrate 108, 208, and a current of the order of 100 A/m² flows through the substrate.

The coupler 330 is preferably 100 mm in length and 0.5 mm in depth and is loosely coupled to the RF transmission line 112, 124, delivering power to the plasma chamber 102. In this embodiment, the coupling is weakly resonant, having an insertion loss in the region of 40 to 50 dB, and thus, only draws a small fraction of the RF power, for example, 0.01%. A voltage of approximately several hundred millivolts in induced in the loop. This voltage is multiplied, rectified and regulated by means of a rectifying circuit 332 to provide approximately 3.3 Volts to power the CMOS circuit 328.

As depicted in FIG. 3, the CMOS circuit 328 comprises a first oscillator 334 and a second oscillator 336.

The first oscillator 334 comprises a temperature sensitive resistor, or thermistor 338 and a variation in the resistance of the thermistor 338 is arranged to modify an oscillating frequency $F_S$ of a signal $S_S$ produced by the oscillator 334. Thus, as the sensed temperature outputted from the sensor provided on the substrate 108, 208, varies, the resistance of the thermistor 338 is modified, thereby altering the oscillator frequency $F_S$.

The second oscillator 336 is arranged to produce a signal $S_{SC}$ having a sub carrier frequency, $F_{SC}$. In the preferred embodiment, the sub carrier frequency $F_{SC}$ is approximately 300 kHz. However, it will be appreciated that the sub carrier frequency $F_{SC}$ may instead be a harmonic of the RF carrier frequency, i.e. 13.56 Hz or any other suitable frequency present in the plasma-processing tool 100.

The signals $S_S$ and $S_{SC}$ are fed into an NAND gate 340, the output of which forms a gate input of a FET transistor 342, to thereby amplitude modulate, AM, the mixed signal. This modulated signal is then coupled to the to the RF transmission line 112, 124, delivering power to the plasma chamber 102.

Thus, the coupler 230, 330 is employed to both scavenge power from the RF power supply 110 or indeed, the bias RF power supply, 122, and to couple the signal carrying the sensor information with the RF carrier signal $S_C$ of the RF power supply.

Figure 4:
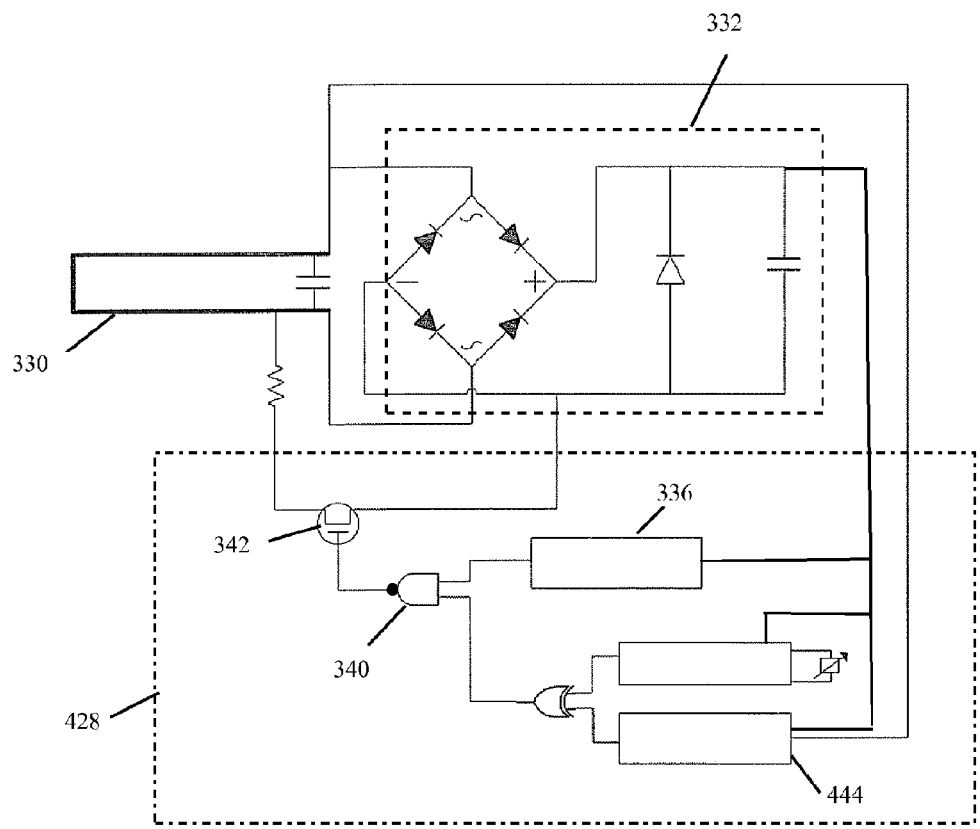
FIG. 4 is a circuit diagram of the coupler of FIG. 2b and CMOS circuit arrangement, according to a preferred embodiment of the present invention.

FIG. 4 depicts a circuit diagram of the coupler 330 and CMOS circuit 428 arrangement, according to a preferred embodiment of the present invention, wherein information determined from multiple sensors may be coupled to an RF carrier signal.

The circuit diagram of FIG. 4 is similar to that of FIG. 3, and accordingly, common features are labelled with the same references.

In contrast to the CMOS circuit 328 of FIG. 3, the CMOS circuit 428 of FIG. 4 further comprises pseudonoise shift register 444.

In the preferred embodiment, power scavenged from the RF power supply, multiplied, rectified and regulated by means of the rectifying circuit 332 is also employed to power the pseudonoise shift register 444. Furthermore, as depicted, the RF signal is fed via the coupler 330 directly to an input of the pseudonoise shift register 444.

The pseudonoise shift register 444 utilises the noise-like RF signal to generate a pseudorandom code for allocation to the sensor signal $S_S$. The sensor signal is then modulated onto the sub-carrier signal $S_{SC}$ and transmitted to the coupler for transmission with the RF carrier signal.

In the preferred embodiment, information determined from multiple sensors may be coupled to the RF carrier signal. To this end, each sensor is associated with a unique pseudorandom code, which is used when modulating the sub-carrier frequency $F_{SC}$.

In the preferred embodiment, combining several sensor information-carrying signals into a single signal is achieved by means of frequency domain multiplexing. However, it will be appreciated that time domain multiplexing may also be employed.

Furthermore, the plasma tool 100 of FIG. 1 may comprise additional sensors associated with a second coupler (not shown) provided at a location within the chamber 102. The second coupler is arranged to transmit the additional sensor information with the RF carrier signal and is used sequentially with the coupler 230, 330.

In the preferred embodiment, the transmission line is matched at 13.56 MHz, making it relatively easy to detect the RF carrier signal at any point along the transmission line, for example, at the RF power supply, or at a window 116, 116', of the chamber 102.

Figure 5:
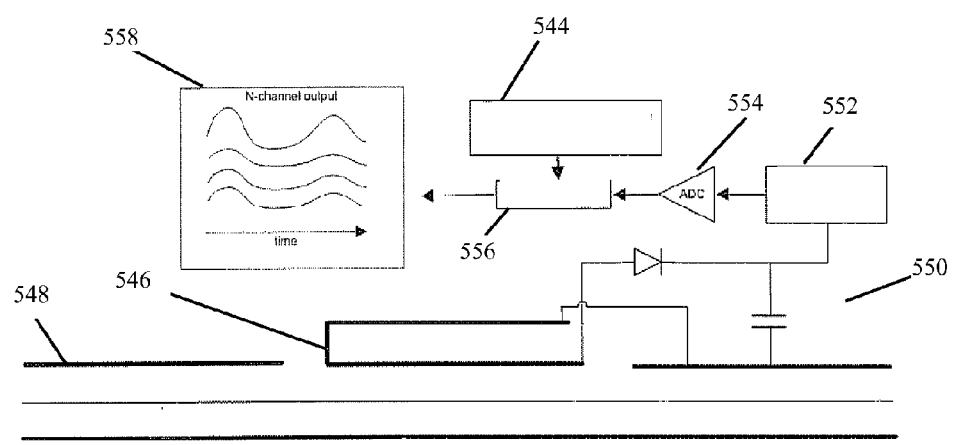
FIG. 5 is a circuit diagram of a receiver according to a preferred embodiment of the present invention.

Referring now to FIG. 5, there is illustrated a receiver circuit for receiving the RF carrier signal being transmitted along the plasma chamber transmission line.

The receiving circuit comprises a coupler 546 coupled to the plasma chamber transmission line 548. The coupler 546 is arranged to pass the received RF carrier signal through a demodulator 550, and through a low pass filter 552 to extract the sub carrier signal from the RF carrier signal. The sub carrier signal is fed into an analogue-to-digital converter, ADC, 554, to convert the signal to a digital signal, which is subsequently demodulated to extract the frequency of the temperature sensor, $F_S$ from which the temperature is extracted.

In the case where information derived from a plurality of sensors, N, is carried by the signal at different frequencies, a pseudorandom register 544 and correlator 556, are employed to extract the relevant frequencies of the sensors from the signal, and there from, the relevant measurements, which are depicted in an output plot 558 of FIG. 5. In the preferred embodiment, bidirectional couplers are employed to enable data to be transmitted in both directions along the transmission line, thereby rendering a location of the coupler within the chamber 202 relatively unimportant.

Although the RF bias power supply is the source of the RF carrier signal employed in the embodiments described, it will be appreciated that the RF power supply may also provide the RF carrier signal. Furthermore, relatively low power is required to excite a wave in the plasma chamber transmission line. Thus, even in the absence of a plasma or external carrier, only a very low battery power would be necessary to generate a signal carrier, thereby greatly extending battery life. Accordingly, it will be appreciated that the methods of the present invention may be employed in the determination of processing parameters from sensors provided within the chamber, regardless of whether the plasma is excited or not. For example, the substrate or wafer temperature may be detected shortly after the plasma has been turned off.

Unlike inductive coupling methods employed in RFID applications, the transmission is not limited by a near field of an antenna, of a few metres at 13.56 MHz. In contrast, the present invention envisages coupling the sensor information-carrying signal into the implicit transmission line at a frequency for which the transmission line is designed and matched to carry, thereby mitigating losses and enabling the signal to be transmitted along the transmission line for long distances. In the embodiments of the present invention, the coupler receiving the sensor information-carrying signal is arranged to pick up an induction field associated with the transmission line current and not the transmitting coil. Thus, it is not necessary for the coupler to be located in the near field of the antenna.

Attenuation is governed by a distance from the transmitting and receiving coils, to the transmission line. In the embodiments of the present invention, the transmitting and receiving coils are within or near an edge of the transmission line, where the magnetic field is the strongest, thereby achieving good coupling. Preferably, the couplers are designed to minimise insertion loss so as not to disturb the plasma process. It will be appreciated that although not essential due to the effectiveness of the coupling achieved, the efficiency of the transmission can be increase by the use of resonant coils for transmission.

The invention is not limited to the embodiments described herein, which may be modified or varied, without departing from the scope of the invention.

The invention claimed is:

1. A system for monitoring a condition in an enclosed plasma processing space, comprising:
   (a) a sensor, arranged to be provided within said enclosed plasma processing space, for sensing a condition in said enclosed plasma processing space, the sensor being connected to an electronic circuit that comprises a modulation circuit;
   (b) the modulation circuit being arranged to modulate an output of said sensor onto a carrier signal to provide a modulated signal;
   (c) a first transmission line coupler arranged to be disposed within said enclosed plasma processing space, connected to said modulation circuit, and arranged to couple said modulated signal to a transmission line, said transmission line being arranged to deliver energy into said enclosed plasma space;
   (d) a second transmission line coupler arranged to be disposed outside said enclosed plasma processing space and coupled to said transmission line;
   (e) a demodulator connected to said second coupler for receiving and demodulating said modulated signal,
   wherein said carrier signal is generated by a first oscillator, and
   said electronic circuit further comprises a second oscillator whose frequency depends upon said condition sensed in said enclosed plasma processing space, wherein said modulation circuit is arranged to modulate said carrier signal with an output of said second oscillator.

2. The system of claim 1 wherein said modulation circuit further comprises a power source, said power source comprising a voltage regulation circuit connected to said first coupler, said voltage regulation circuit being driven by power scavenged from said transmission line by said first coupler.

3. The system of claim 1, wherein said system further comprises an identifying code generator providing at an output, an identifying code signal, said identifying code signal being combined with an output of said second oscillator to provide said output of said sensor.

4. The system of claim 3, comprising:
   a plurality of sensors arranged to be provided within said enclosed plasma processing space, each sensor being arranged to sense a condition in said enclosed plasma processing space;
   the identifying code generator providing at an output, an identifying code signal, said identifying code signal being combined with an output of said second oscillator to provide a unique sensor signal,
   wherein said unique sensor signals are combined to provide a composite signal at said output of said sensor.

5. The system of claim 1, wherein said sensor is provided on a substrate to be processed and said first transmission line coupler is a coil arranged to form a loop comprising two plane strips embedded in said substrate.

6. The system of claim 1, wherein said first transmission line coupler has a length of approximately 100 mm and a depth of approximately 0.5 mm.

7. The system of claim 1, wherein said first transmission line coupler exhibits an insertion loss of about 40 to 50 dB.

8. The system of claim 1, wherein the first and second transmission line couplers are bidirectional couplers enabling bidirectional data transmission along the transmission line.

9. A plasma processing tool comprising:
   a) an enclosed plasma processing space;
   b) a transmission line for delivering energy into said enclosed plasma processing space; and
   c) the system for monitoring a condition in the enclosed plasma processing space of claim 1.

10. The plasma processing tool of claim 9 wherein said condition is a processing parameter of the plasma processing tool.

11. The plasma processing tool of claim 10 wherein said processing parameter anyone of temperature, etch speed ion flux to a surface of said substrate, floating potential of a surface of a substrate to be processed, electric field uniformity at a surface of a substrate to be processed, and layer thickness of a substrate to be processed.

12. A method of monitoring a condition in an enclosed plasma processing space, comprising:

sensing a condition by a sensor within said enclosed plasma processing space, the sensor being connected with an electronic circuit that comprises a modulation circuit;

producing an output onto a carrier signal based on said condition;

modulating said output to provide a modulated signal;

coupling said modulated signal to a transmission line within said enclosed plasma space by a first transmission line coupler attached with the sensor, the transmission line being arranged to deliver energy into said enclosed plasma space;

decoupling said modulated signal from said transmission line externally from said enclosed plasma space; and demodulating said modulated signal by a demodulator connected to a second transmission line coupler, wherein the second transmission line coupler is disposed outside said enclosed plasma processing space and coupled to said transmission line, the method further comprising:

generating said carrier signal using a first oscillator, and modulating said carrier signal with an output of a second oscillator, wherein the electronic circuit comprises the second oscillator, and the frequency of the second oscillator depends upon said condition sensed in said enclosed plasma processing space.

* * * * *